United States Patent
Basu et al.

(10) Patent No.: US 11,867,773 B2
(45) Date of Patent: Jan. 9, 2024

(54) SWITCHED CAPACITOR INTEGRATOR CIRCUIT WITH REFERENCE, OFFSET CANCELLATION AND DIFFERENTIAL TO SINGLE-ENDED CONVERSION

(71) Applicant: TEXAS INSTRUMENTS INCORPORATED, Dallas, TX (US)

(72) Inventors: Partha Sarathi Basu, Tucson, AZ (US); Dimitar Trifonov Trifonov, Vail, AZ (US); Tony Ray Larson, Tucson, AZ (US); Chao-Hsiuan Tsay, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 494 days.

(21) Appl. No.: 16/888,927

(22) Filed: Jun. 1, 2020

(65) Prior Publication Data
US 2020/0400755 A1  Dec. 24, 2020

Related U.S. Application Data

(60) Provisional application No. 62/862,706, filed on Jun. 18, 2019.

(51) Int. Cl.
  *G01R 33/00* (2006.01)
  *G01R 33/07* (2006.01)
  *G06G 7/184* (2006.01)

(52) U.S. Cl.
  CPC ....... *G01R 33/0017* (2013.01); *G01R 33/072* (2013.01); *G06G 7/184* (2013.01)

(58) Field of Classification Search
  CPC .. G01R 33/0052; G01R 33/07; G01R 33/075; G01R 33/0005; G01R 33/0017;
  (Continued)

(56) References Cited

U.S. PATENT DOCUMENTS 6,031,369 A    2/2000  Trontelj
8,203,329 B2   6/2012  Hohe
(Continued)

FOREIGN PATENT DOCUMENTS

| EP | 3457154 A1 | 3/2019 |
|---|---|---|
| WO | 2004021251 | 11/2004 |
| WO | 2018059796 | 4/2018 |

OTHER PUBLICATIONS

Supplemental European Search Report for Application No. 20823036.7, dated Jul. 5, 2022, 9 pgs.
(Continued)

*Primary Examiner* — Feba Pothen
*Assistant Examiner* — Brent J Andrews
(74) *Attorney, Agent, or Firm* — John R. Pessetto; Frank D. Cimino

(57) ABSTRACT

A dual integrator system comprises two integrators, an output stage, and a switching network. The first and second integrators receive a differential Hall sensor signal and a reference voltage. The first integrator outputs a first integrator signal based on the differential Hall sensor and the reference voltage. The second integrator outputs a second integrator signal based on the differential Hall sensor signal and the reference voltage. The first integrator comprises a first offset cancellation feedback loop, and the second integrator comprises a second offset cancellation feedback loop. The switching network is coupled to the first and second integrators and to the output stage, and alternates which of the first and second integrators is coupled to the output stage. In some embodiments, the first and second integrators each perform a reset operation, a sampling operation, an integration operation, a differential to single-ended conversion operation, and a holding operation.

9 Claims, 9 Drawing Sheets

(58) Field of Classification Search
CPC .............. G01R 33/072; G01R 33/0029; G01R 33/0094; H01L 43/04; H01L 43/065; H01L 43/14; H01L 27/22; G06G 7/184
See application file for complete search history.

(56) References Cited

U.S. PATENT DOCUMENTS

| | | |
|---|---|---|
| 8,680,846 B2 | 3/2014 | Cesaretti |
| 9,551,762 B1 | 1/2017 | Cesaretti |
| 2005/0073293 A1 | 4/2005 | Hastings |
| 2008/0238410 A1 | 10/2008 | Charlier |
| 2009/0051421 A1 | 2/2009 | Mathe |
| 2009/0212765 A1 | 8/2009 | Doogue |
| 2010/0134101 A1 | 6/2010 | Riva |
| 2012/0016614 A1 | 1/2012 | Hohe |
| 2012/0229204 A1 | 9/2012 | Han |
| 2014/0077873 A1 | 3/2014 | Motz et al. |
| 2014/0163911 A1 | 6/2014 | Rohrer |
| 2015/0301149 A1 | 10/2015 | Cesaretti |
| 2016/0139230 A1* | 5/2016 | Petrie ................. G01D 5/2448 324/225 |
| 2016/0252599 A1 | 9/2016 | Motz |
| 2017/0016965 A1 | 1/2017 | Chaware |
| 2017/0030979 A1 | 2/2017 | Cesaretti |
| 2017/0322051 A1 | 11/2017 | Nobira |
| 2018/0011140 A1 | 1/2018 | Chaware |
| 2019/0049530 A1 | 2/2019 | Latham et al. |
| 2019/0154737 A1 | 5/2019 | Nobira |
| 2020/0319272 A1* | 10/2020 | Romero ............. G01R 33/0041 |

OTHER PUBLICATIONS

M. Kayal et al. "Automatic Calibration of Hall Sensor Microsystems." Microelectronics Journal 37, 2006 1569-1575 (7 pages).
International Search Report in corresponding PCT Application PCT/US2020/037397, dated Nov. 12, 2020 (2 pages).
International Search Report in corresponding PCT Application PCT/US2020/038338, dated Sep. 10, 2020 (2 pages).
Supplemental European Search Report, App. No. 20827052.0, dated Jul. 18, 2022, 6 pgs.

* cited by examiner

SWITCHED CAPACITOR INTEGRATOR CIRCUIT WITH REFERENCE, OFFSET CANCELLATION AND DIFFERENTIAL TO SINGLE-ENDED CONVERSION

CROSS-REFERENCE TO RELATED APPLICATIONS

This application claims priority to U.S. Provisional Application No. 62/862,706, filed Jun. 18, 2019, which is hereby incorporated by reference.

BACKGROUND

Large offset errors plaguing Hall sensors used for magnetic field or current sensing can be substantially reduced by "spinning" the Hall sensors, that is, by spatially rotating the Hall bias current to all Hall terminals. The Hall sensor output signals are averaged by a switching network and an integrator. In some implementations with continuous sampling of the Hall sensor output signal, a sample and hold circuit and an output amplifier with a reference resistance network introduce a reference voltage.

Because the time required to transfer the integrator output to the sample and hold circuit and the integrator reset time limit the speed at which the Hall sensors may be spun, some signal chains include two integrators in parallel, such that one integrator holds the signal while the second integrator resets and integrates the Hall sensor output signal. However, the resulting signal chain occupies a large area on a semiconductor die and consumes a large amount of power. In addition, the reference resistor network causes the reference input to offer a relatively low resistance, which makes it difficult to multiplex other functions to the reference pin for testing during manufacture. The lower input resistance also requires a low impedance drive on the reference pin.

SUMMARY

In one example, a circuit comprises a switched capacitor module, an integrator, and two feedback loops. The switched capacitor module is configured to receive a positive differential input signal and a negative differential input signal, and includes a switching network, a first sampling capacitor, and a second sampling capacitor. The integrator includes a positive input coupled to the first sampling capacitor and a negative input coupled to the second sampling capacitor, as well as positive and negative outputs. The first feedback loop includes a first switch coupled between the positive input and the negative output of the integrator, a second switch coupled to the positive output, and a first feedback capacitor coupled between the second switch and the negative output. The second feedback loop includes a third switch coupled between the negative input and the positive output of the integrator, a fourth switch coupled to the negative input, and a second feedback capacitor coupled between the fourth switch and the positive output.

In some implementations in a reset operating mode, the switching network disconnects the first sampling capacitor from the positive differential input signal and the second sampling capacitor from the negative differential input signal, and couples the first and second sampling capacitors to each other. The first, second, third, and fourth switches are closed. In some implementations in a sampling operating mode, the first and third switches are closed, and the second and fourth switches are open. The switching network provides the positive differential input signal to the first sampling capacitor and the negative differential input signal to the second sampling capacitor, and uncouples the first and second sampling capacitors from each other.

In some implementations in an integrating operating mode, the first and third switches are open, and the second and fourth switches are closed. The switching network disconnects the first sampling capacitor from the positive differential input signal and the second sampling capacitor from the negative differential input signal, and couples the first and second sampling capacitors to each other.

In some examples, the circuit also includes five additional switches and an output stage. The fifth switch is coupled between the first feedback capacitor and the negative output. The sixth switch is configured to couple the second feedback capacitor to the positive output or to the positive input. The seventh switch is coupled between the negative and positive outputs. The eighth switch is coupled between the negative output and an input of the output stage. The ninth switch is configured to couple the first feedback capacitor to an output of the output stage or to a resistor, which is further coupled to the output of the output stage.

In some examples in a differential to single-ended conversion operating mode, the switching network disconnects the first and second sampling capacitors from the positive and negative differential input signals and coupled the first and second sampling capacitors to each other. The first, fifth, and eighth switches are open, and the second, third, fourth, and seventh switches are closed. The sixth switch couples the second feedback capacitor to the positive input, and the ninth switch couples the first feedback capacitor to the resistor.

In some implementations, the circuit also includes a compensation capacitor coupled to the positive input and a tenth switch configured to couple the compensation capacitor to the output of the output stage or to ground. In the differential to single-ended conversion operating mode, the tenth switch couples the compensation capacitor to the output of the output stage. In operating modes other than the differential to single-ended conversion operating mode, the tenth switch couples the compensation capacitor to ground.

In some examples in a holding operating mode, the switching network disconnects the first and second sampling capacitors from the positive and negative differential input signals and couples the first and second sampling capacitors to each other. The first, fifth, and seventh switches are open, and the second, third, fourth, and eighth switches are closed. The sixth switch couples the second feedback capacitor to the positive input, and the ninth switch couples the first feedback capacitor to the output of the output stage. In some implementations, the resistor is a first resistor, and the output stage includes a buffer, a capacitor, and two resistors. The buffer has positive and negative inputs and the output of the output stage. The capacitor is coupled to the positive input of the buffer, and the eighth switch is coupled to the positive input of the buffer. The second resistor is coupled to the negative input of the buffer, and the third resistor is coupled between the negative input of the buffer and the output.

In some implementations, the circuit includes a second switched capacitor module configured to receive a reference voltage. The second switched capacitor module includes a second switching network configured to receive the reference voltage and two capacitors. The second switching network is coupled between the positive and negative inputs and the negative output. In some implementations, the circuit includes an offset cancellation switched capacitor module comprising two capacitors and a second switching network coupled between the positive and negative inputs and the positive and negative outputs.

BRIEF DESCRIPTION OF THE DRAWINGS

For a detailed description of various examples, reference will now be made to the accompanying drawings in which.

DETAILED DESCRIPTION

In the disclosed dual integrator systems, a first integrator and a second integrator are both configured to receive a differential Hall sensor signal and a reference voltage. A switching network coupled to the first and second integrators and to an output stage is configured to alternate which of the first and second integrators is coupled to the output stage. While the first integrator performs a holding operation, the switching network couples the first integrator to the output stage and uncouples the second integrator from the output stage. While uncoupled from the output stage, the second integrator performs a reset operation, a sampling operation, an integrating operation, and a differential to single-ended conversion operation.

Each integrator includes an offset cancellation feedback loop, which includes a switched capacitor module coupled to an input and an output of the integrator. Each integrator also includes an additional switched capacitor module coupled to an input and an output of the integrator that is configured to receive the reference voltage. In examples in which the sampling and integrating operations are performed a predetermined number of times N, the capacitances of the offset cancellation feedback loop and the additional switched capacitor module are chosen such that only a fraction 1/N of the reference voltage or the offset voltage are integrated in each integrating operation.

Figure 1:
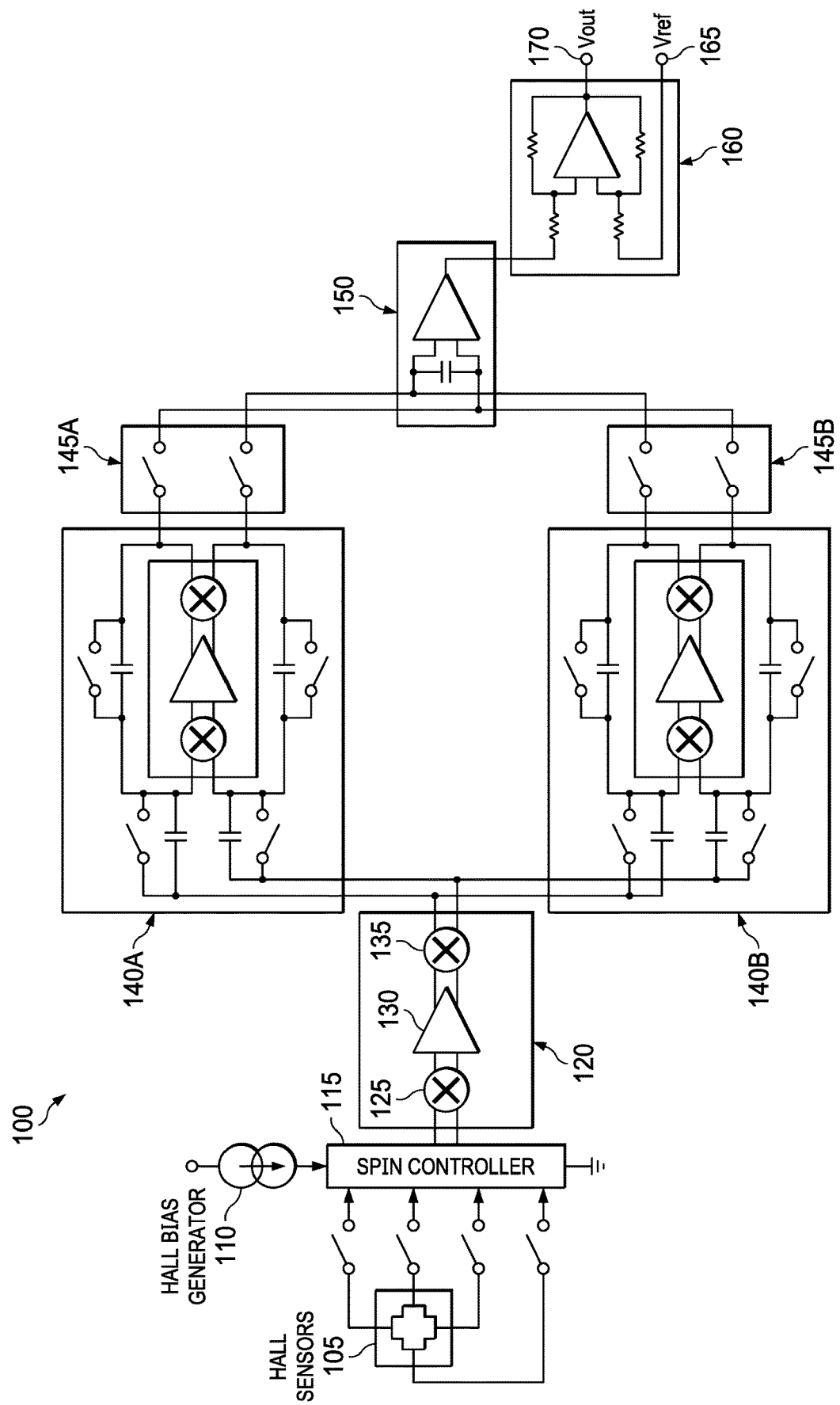
FIG. 1 illustrates a Hall sensor signal chain with dual integrators.

FIG. 1 illustrates a Hall sensor signal chain 100 with dual integrators. The signal chain 100 includes Hall sensors 105, a Hall bias generator 110, a spin controller 115, an amplifier stage 120, chopped integrators 140A-B, a stage 150 for sampling and holding (S/H) and differential to single-ended conversion, and an output amplifier stage 160. Hall sensors 105 are coupled to the spin controller 115, which receives a Hall bias current from the Hall bias generator 110. The output of spin controller 115 is provided to amplifier stage 120. Amplifier stage 120 includes a first chopper 125, an amplifier 130, and a second chopper 135. The chopped and amplified output signal from amplifier stage 120 is provided to both chopped integrators 140A-B.

As discussed previously herein in the background, the time required to transfer an integrator output from a chopped integrator 140A or 140B to stage 150 limits the speed at which the Hall sensors 105 may be spun. Switching networks 145A-B switch between the two chopped integrators 140A-B, alternating which integrator integrates the signal and which transfers the integrator output to stage 150. The S/H and conversion stage 150 samples and holds the integrator output signal and converts it from a differential signal to a single-ended signal. Output amplifier stage 160 receives the reference voltage Vref 165 and includes a reference resistor network. The signal Vout 170 is output from amplifier stage 160.

At least the amplifiers in integrators 140A-B must be chopped or include auto-zero stabilization to reduce offset voltage introduced by the amplifiers. As shown in signal chain 100, amplifier stage 120 also includes choppers to reduce offset voltage introduced by amplifier 130. The chopping switches for the amplifiers and the reference resistor network in amplifier stage 160 occupy a large area on a semiconductor die and consume a large amount of power. Further, the reference resistor network causes the input pin for Vref 165 to offer a low input resistance, which makes it difficult to multiplex other functions to the pin for testing during manufacture. The fixed input resistance also requires a low impedance drive on the pin.

Figure 2A:
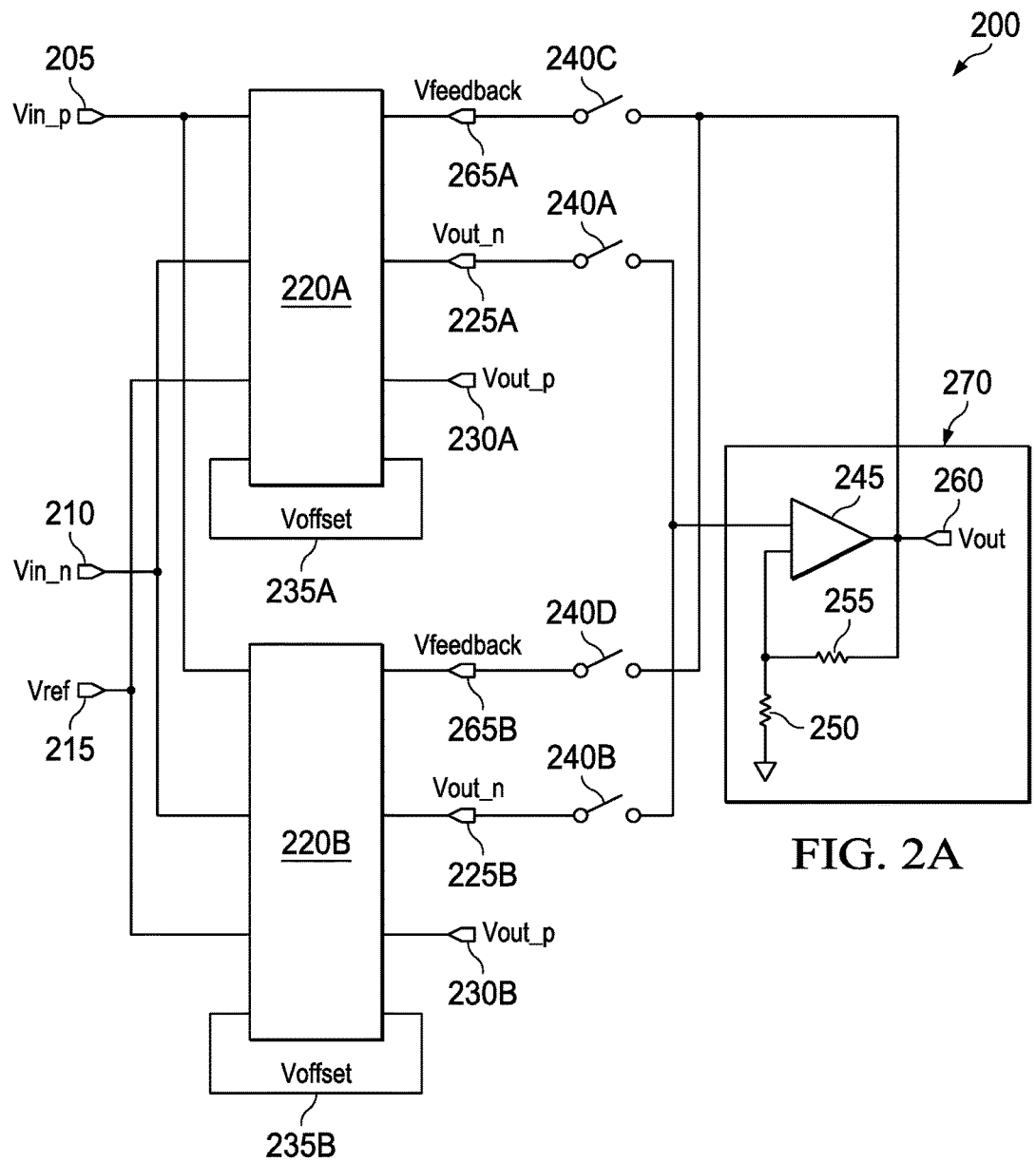
FIGS. 2A-B illustrate a block diagram of a dual integrator system and a timing diagram showing the operating modes of the two integrators.
Figure 2B:
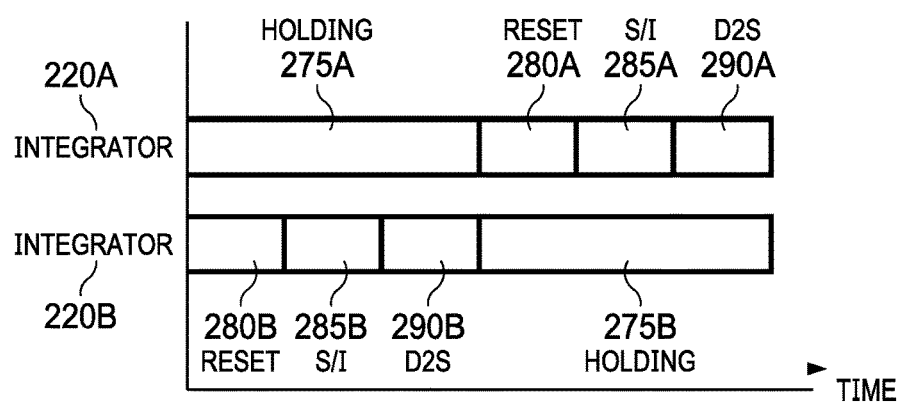

FIGS. 2A-B illustrate a block diagram of a dual integrator system 200 and a graph showing the operating modes of the two integrators. For ease of explanation, the block diagram of dual integrator system 200 is described with reference to signal chain 100 shown in FIG. 1. In FIG. 2A, the dual integrator system 200 includes two integrators 220A-B, each of which receive a differential input signal from amplifier stage 120 in signal chain 100, where Vin_p 205 represents the positive differential input signal and Vin_n 210 represents the negative differential input signal. Integrators 220A-B also each receive a reference voltage Vref 215. Integrator 220A includes a feedback loop to compensate for a voltage offset Voffset 235A introduced by the integrator 220A. Similarly, integrator 220B includes a feedback loop to compensate for a voltage offset Voffset 235B introduced by the integrator 220B.

Integrator 220A has two outputs signals: Vout_n 225A and Vout_p 230A. Vout_n 225A is provided to output stage 270 while switch 240A is closed. Switch 240A can be open while integrator 220A performs reset, sample and integrate (S/I), and differential to single ended (D2S) conversion functions, and closed while integrator 220A performs a hold function. Similarly, integrator 220B has two output signals: Vout_n 225B and Vout_p 230B. Vout_n 225B is provided to output stage 270 while switch 240B is closed. Integrators 220A-B alternate which integrator output is provided to output stage 270, as will be described further herein with reference to FIG. 2B.

Integrators 220A-B also output a feedback voltage Vfeedback 265A-B, respectively, which are coupled to the output of output stage 270 by switches 240C-D, respectively. While one of the integrators is in a hold operating mode, the corresponding switch 240C or 240D couples the corresponding feedback voltage Vfeedback 265A or 265B to the output of the output stage 270. While the integrators are not in a hold operating mode, the switches 240C-D disconnect Vfeedback 265A-B from the output of the output stage 270. Output stage 270 includes a buffer 245 that provides the desired output driving capability for system 200, and outputs the single-ended output signal Vout 260. The outputs Vout_n 225A-B are provided to a first input of buffer 245. A resistor 250 is coupled to a second input of buffer 245 and to ground. A second resistor 255 is coupled between the second input and the output of buffer 245.

In FIG. 2B, a graph illustrates the offset operating modes of integrators 220A-B. First, integrator 220A performs a hold function 275A and switch 240A is closed, coupling Vout_n 225A to output stage 270. While integrator 220A performs the hold function 275A and switch 240A is closed, switch 240B is open, disconnecting integrator 220B from output stage 270. Integrator 220B performs a reset function 280B, a S/I function 285B, and a D2S function 290B. In response to integrator 220B completing the D2S function 290B, switch 240A opens, disconnecting integrator 220A from output stage 270, and switch 240B closes, coupling Vout_n 225B to output stage 270. Integrator 220B performs the hold function 275B while integrator 220A performs the reset function 280A, the S/I function 285A, and the D2S function 290A. Integrators 220A-B may sample and integrate the differential input signals Vin_p 205 and Vin_n 210 any appropriate number of times N during the S/I functions 285A-B. N may be chosen based on the number of input signal phases.

Figure 3A:
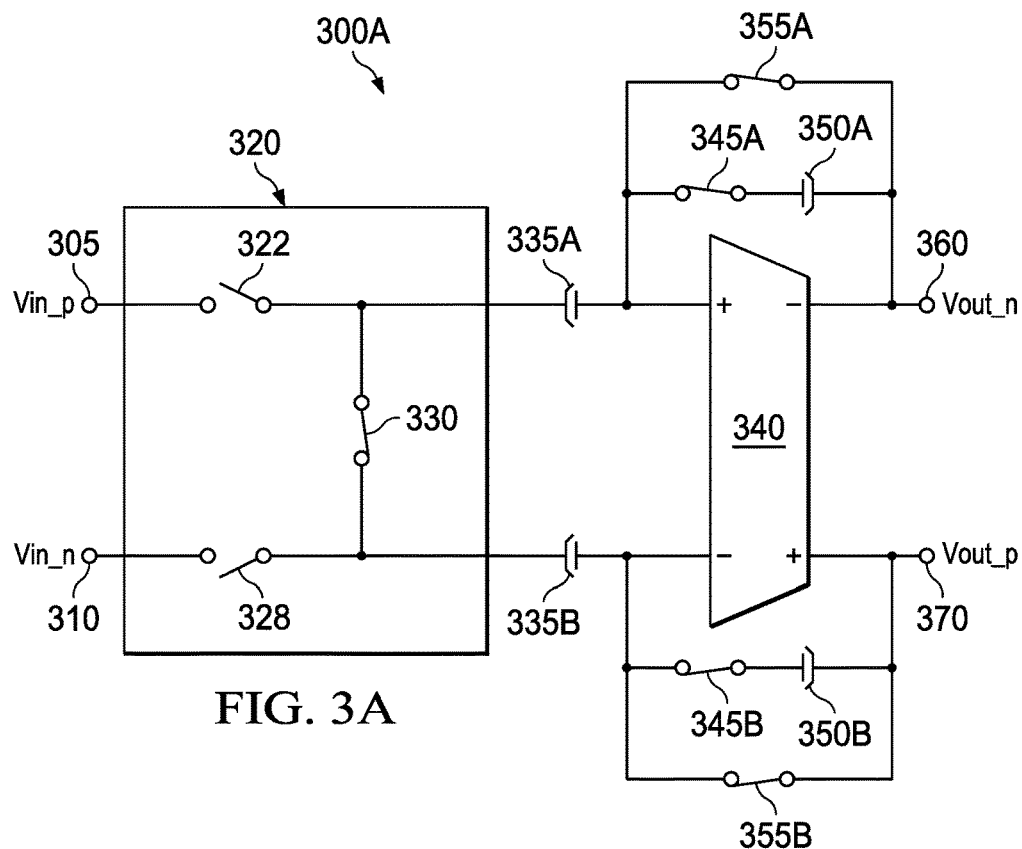
FIGS. 3A-C illustrate the operating modes of an integrator in a dual integrator system such as the one shown in FIG. 2A and the corresponding integrator configurations.
Figure 3B:
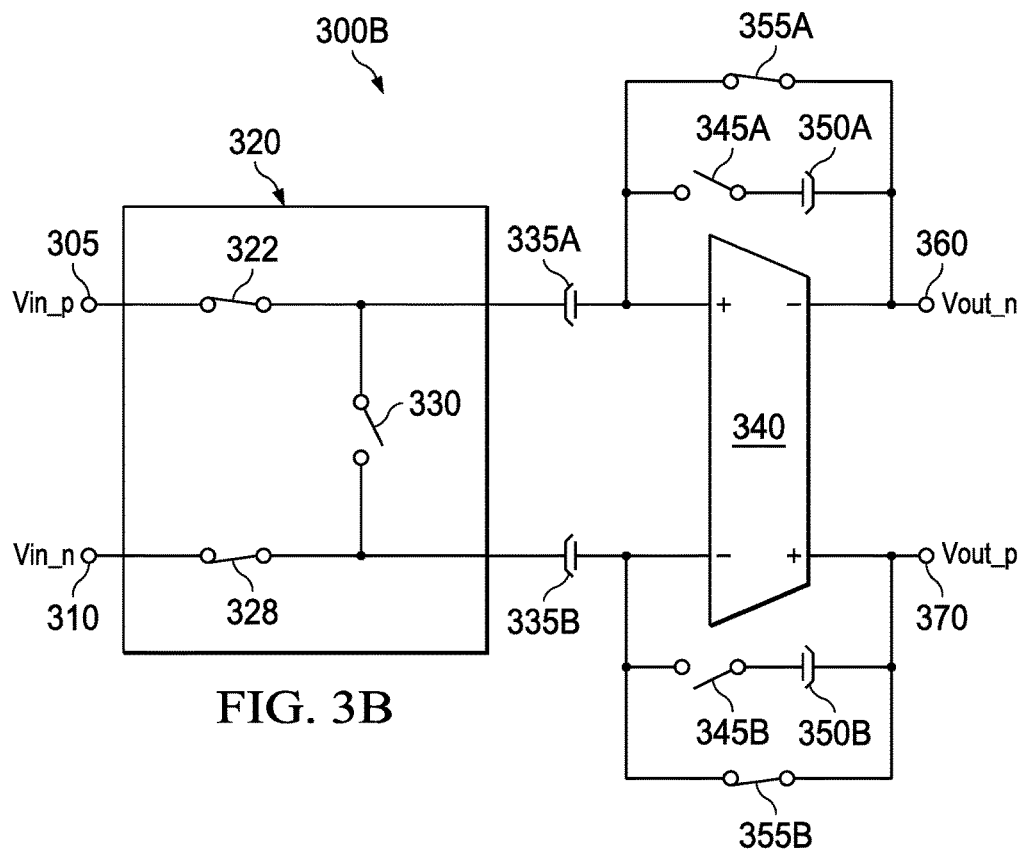
Figure 3C:
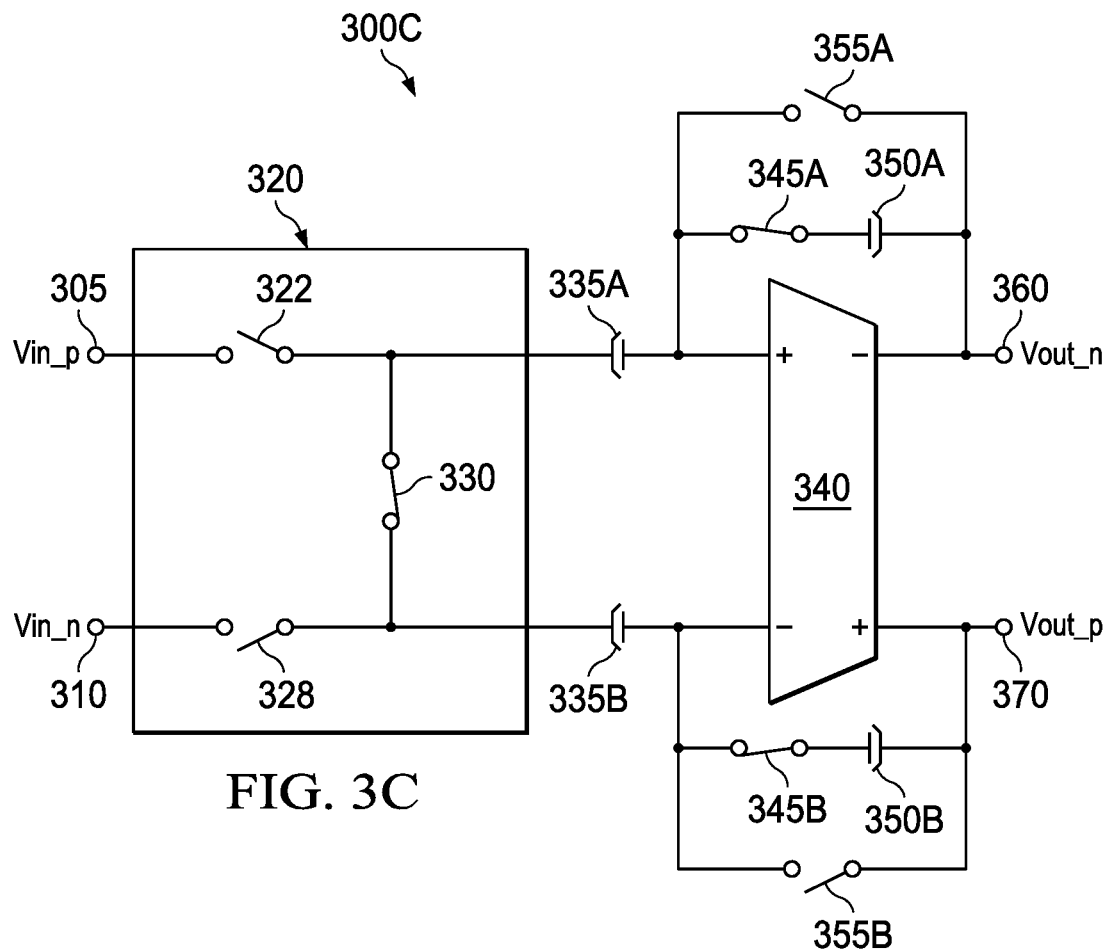

FIGS. 3A-C illustrate the operating modes of an integrator such as integrators 220A-B shown in FIG. 2A and the corresponding integrator configurations. FIG. 3A illustrates an integrator configuration 300A corresponding to a reset operating mode. The integrator 300 includes a switching network 320, input sampling capacitors 335A-B, integrator 340, output feedback capacitors 350A-B, and switches 345A-B and 355A-B. Switching network 320 includes switches 322, 328, and 330.

Switch 322 is coupled between an input node configured to receive the positive input differential signal Vin_p 305 and input sampling capacitor 335A, and is open in the reset operating mode. Switch 328 is coupled between an input node configured to receive the negative input differential signal Vin_n 310 and input sampling capacitor 335B, and is open in the reset operating mode. Switch 330 is coupled between input sampling capacitors 335A-B, and is closed in the reset operating mode.

Input sampling capacitor 335A is further coupled to a positive input for amplifier 340, and input sampling capacitor 335B is further coupled to a negative input for amplifier 340. Switch 355A is coupled between the positive input and a negative output for amplifier 340. Switch 345A is coupled between the positive input of amplifier 340 and output feedback capacitor 350A, which is further coupled to the negative output for amplifier 340. The integrator output signal Vout_n 360 is available on the negative output of amplifier 340. Switch 355B is coupled between the negative input and a positive output for amplifier 340. Switch 345B is coupled between the negative input of amplifier 340 and output feedback capacitor 350B, which is further coupled to the positive output for amplifier 340. The integrator output signal Vout_p 370 is available on the positive output of amplifier 340.

Configuration 300A resets the integrator 300 by shorting its input sampling capacitors 335A-B and output feedback capacitors 350A-B, such that none of capacitors 335A-B and 350A-B have a voltage across them. Switches 345A-B and 355A-B are closed during the reset operating mode to short the output feedback capacitors 350A-B. Switch 330 is closed to short input sampling capacitors 335A-B.

FIG. 3B illustrates an integrator configuration 300B corresponding to a sampling operating mode. In configuration 300B, switches 322 and 328 are closed. Switch 330 is open, disconnecting input sampling capacitors 335A-B from each other. Switches 355A-B remain closed, but switches 345A-B are open and disconnect output feedback capacitors 350A-B from the inputs of amplifier 340. While the integrator receives differential input signals Vin_p 305 and Vin_n 310, input sampling capacitors 335A-B store charge such that at the end of the sampling operation, input sampling capacitors 335A-B each have a voltage Vinput across them. Input sampling capacitor 335A has a positive voltage Vinput across it, and input sampling capacitor 335B has a negative voltage Vinput across it. Because switches 345A-B are open, output feedback capacitors 350A-B do not store charge and do not have a voltage across them in this example.

FIG. 3C illustrates an integrator configuration 300C corresponding to an integrating mode of operation. In configuration 300C, switches 322 and 328 are open. Switch 330 is closed, connecting input sampling capacitors 335A-B together. Switches 345A-B are closed, connecting output feedback capacitors 350A-B to the inputs of amplifier 340 and to input sampling capacitors 335A-B. Switches 355A-B are open. The charge stored in input sampling capacitors 335A-B is transferred to output feedback capacitors 350A-B such that at the end of the integrating operation, input sampling capacitors 335A-B do not have the voltage Vinput across them while output feedback capacitors 350A-B each have a voltage Vo across them. Output feedback capacitor 350A has a negative voltage Vo across it, and output feedback capacitor 350B has a positive voltage Vo across it.

The integrator 300 may perform S/I operations any appropriate number of times N according to the number of Hall spinning phases. At the beginning of the Nth sampling operation, for example, input sampling capacitors 335A-B do not store charge and do not have a voltage across them. The output feedback capacitors 350A-B have accumulated charge such that the voltage across them is (N−1)Vo. At the end of the Nth sampling operation, input sampling capacitors 335A-B have the voltage Vinput across it. At the end of the Nth integrating operation, the output feedback capacitors 350A-B each have a voltage (N)Vo across them.

Figure 4:
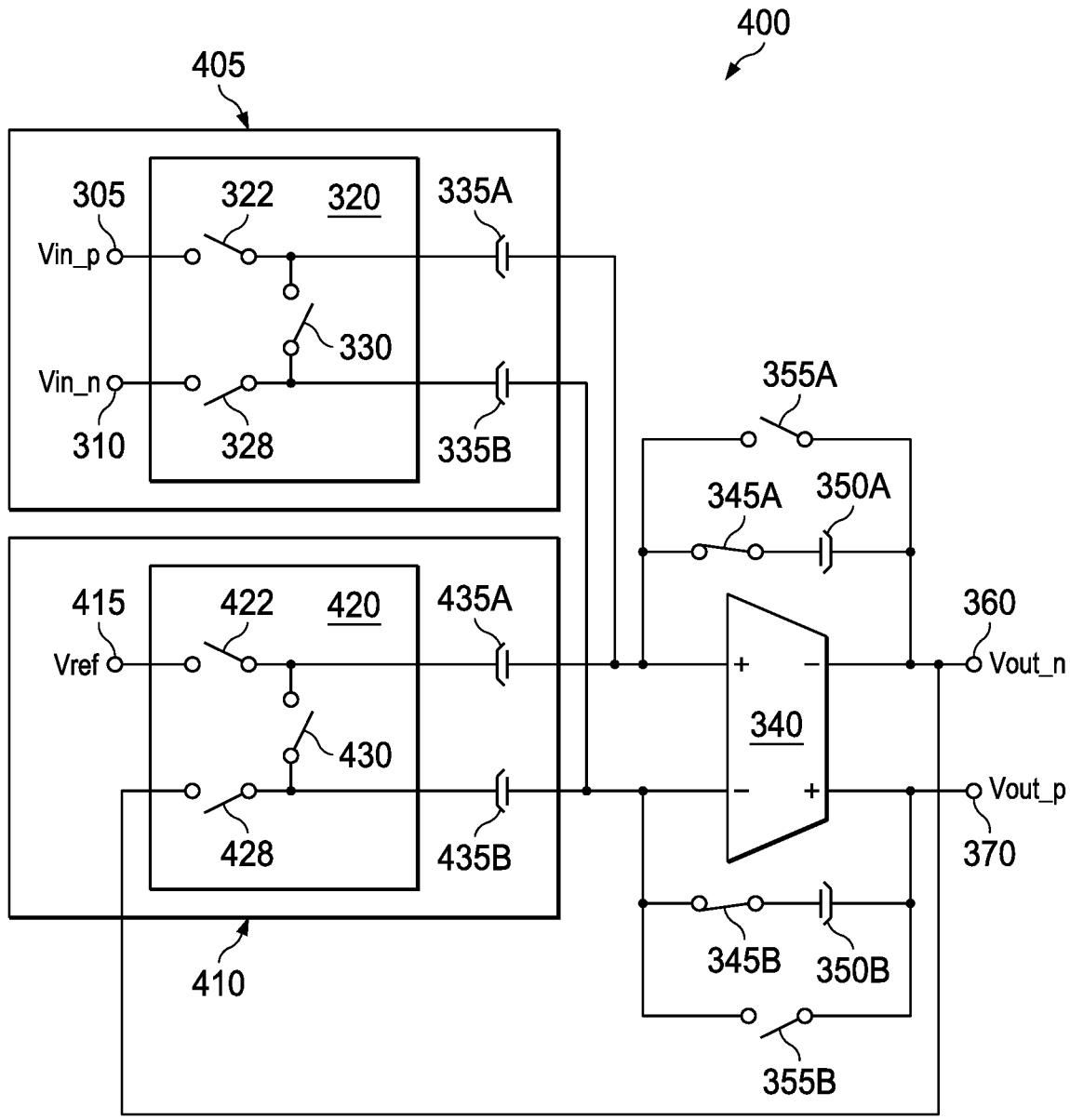
FIG. 4 illustrates an integrator input stage with a reference voltage input for use in a dual integrator system such as the one shown in FIG. 2A.

FIG. 4 illustrates an integrator configuration 400 with a reference voltage input. For ease of illustration, configuration 400 is described with reference to the integrator 300 shown in the configurations 300A-C in FIGS. 3A-C. The switched capacitor module 405 includes the switching network 320 and input sampling capacitors 335A-B in integrator 300. A second switched capacitor module 410 includes a switching network 420 and capacitors 435A-B. Switching network 420 includes switches 422, 428, and 430. Switch 422 is coupled between an input node configured to receive a reference voltage Vref 415 and capacitor 435A. Switch 428 is coupled between the negative output of amplifier 340 and capacitor 435B. Switch 430 is coupled between capacitors 435A-B.

Capacitor 435A is further coupled to the positive input for amplifier 340, and capacitor 435B is further coupled to a negative input for amplifier 340. Integrator 400 samples the reference voltage Vref 415 with respect to a common mode voltage Vcm of the output signal Vout_n 360. If instead the integrator 400 samples Vref 415 with respect to ground, the integrator output quickly reaches the supply rail voltages due to the limited integrator input swing. By instead sampling Vref 415 with respect to the Vcm of Vout_n 360, integrator 400 can increase the swing voltage for the Hall signal.

The capacitance values for capacitors 435A-B are chosen based on the number N of S/I operations and the number of Hall spinning phases. For example, the integrator 400 performs S/I operations four times before continuing to the hold operation. The capacitance values for capacitors 435A-B are chosen to be one fourth the capacitance value for output feedback capacitors 350A-B. For example, capacitors 335A-B have a capacitance value of twelve times a capacitance C (12C), capacitors 350A-B have a capacitance value of 4C, and capacitors 435A-B have a capacitance value of C. The output Vout_n 360 may be represented as:

$$\frac{Vdd}{2} + 2\left[\frac{1}{4}\left(Vref\ 415 - \frac{Vdd}{2}\right) + \frac{12}{4}(Vin\_p\ 305 - Vin\_n\ 310)\right]$$

where Vdd represents a supply voltage.

The integrator 400 adds a quarter of the difference between Vref 415 and Vout_n 360, Vdd/2, at each integration, such that after the four integration operations, the full difference between Vref 415 and Vdd/2 is summed. By incorporating the reference voltage Vref 415 into the input of integrator 340, the reference resistor network in output amplifier stage 160 can be eliminated, reducing the area needed for integrator 400 on a semiconductor die. In addition, the input impedance for reference voltage Vref 415 is increased such that another amplifier is not needed to provide a low impedance drive on the pin, which simplifies the integrator circuit.

Figure 5:
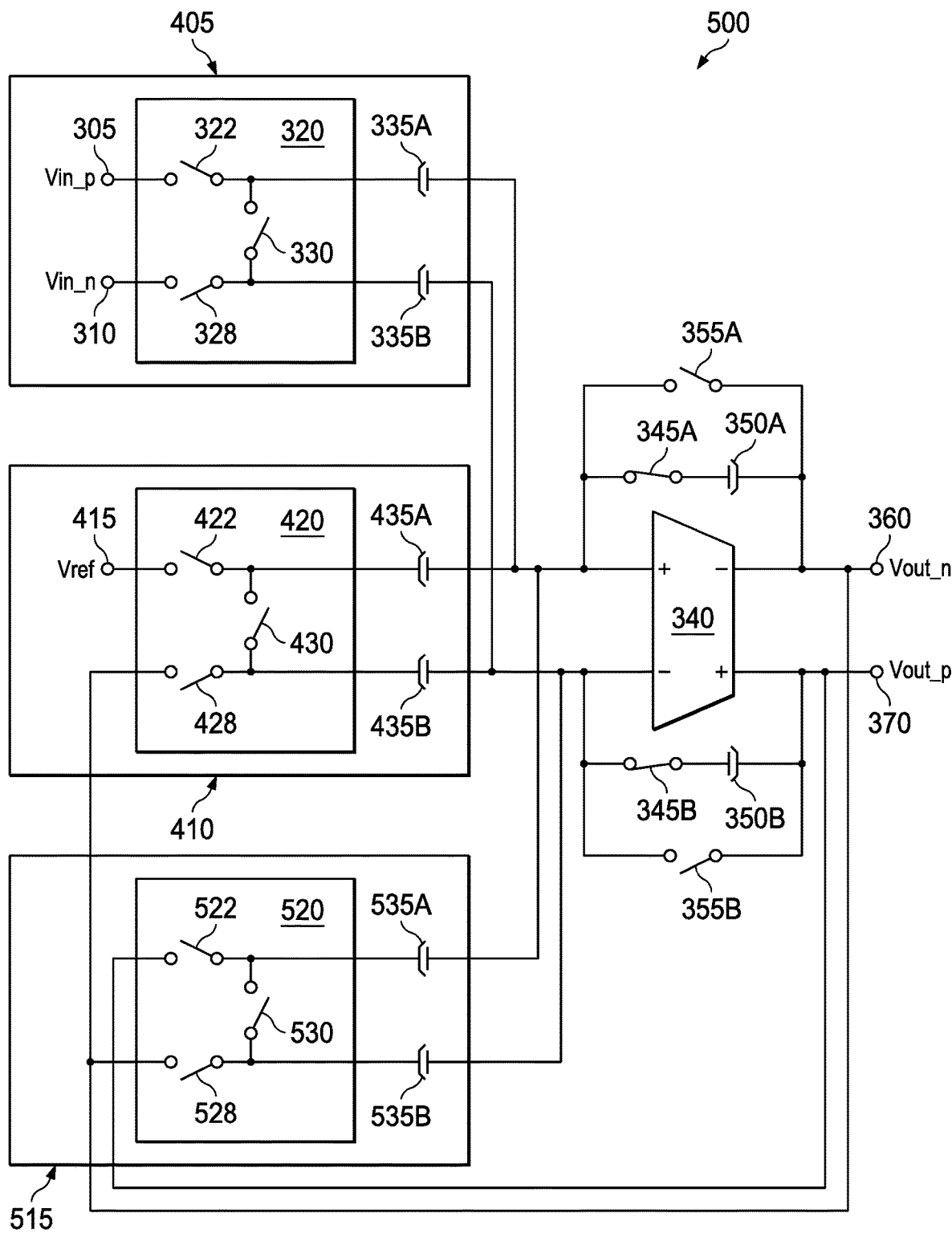
FIG. 5 illustrates an integrator input stage with a reference voltage input and an offset feedback loop for use in a dual integrator system such as the one shown in FIG. 2A FIGS. 6A-B illustrate the integrator configurations for a differential to single-ended conversion operating mode and a hold operating mode.

FIG. 5 illustrates an integrator configuration 500 with integrator offset cancellation. For ease of illustration, configuration 500 is described with reference to the integrator 300 shown in the configurations 300A-C in FIGS. 3A-C and integrator 400 shown in FIG. 4. The switched capacitor module 515 includes a switching network 520 and capacitors 535A-B. Switching network 520 includes switches 522, 528, and 530. Switch 522 is coupled between the positive output of amplifier 340 and capacitor 535A. Switch 528 is coupled between the negative output of amplifier 340 and capacitor 535B. Switch 530 is coupled between capacitors 535A-B. Capacitor 535A is further coupled to the positive input for amplifier 340, and capacitor 535B is further coupled to the negative input for amplifier 340.

The same strategy described with reference to integrator 400 in FIG. 4 to incorporate the reference voltage 415 is used to cancel the offset introduced by amplifier 340. Integrator 500 adds a portion of the amplifier offset in each integration step such that after the Nth S/I operation, the full amplifier offset is incorporated and cancels the offset introduced by amplifier 340. By cancelling the offset in this way, chopping switches and auto-zero stabilization circuits may be eliminated from integrator 400, which decreases the area and power consumption of integrator 500.

Figure 6A:
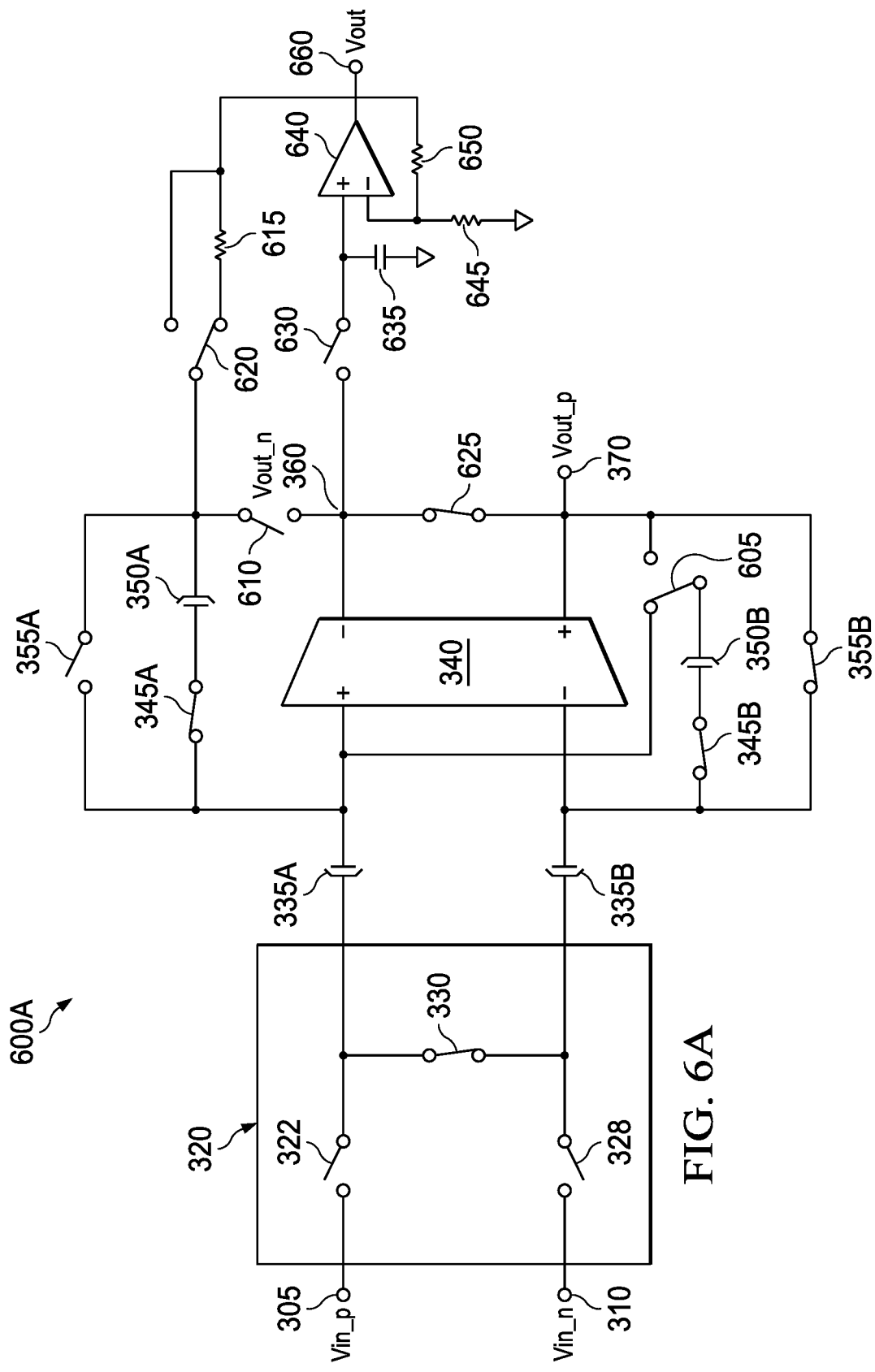
Figure 6B:
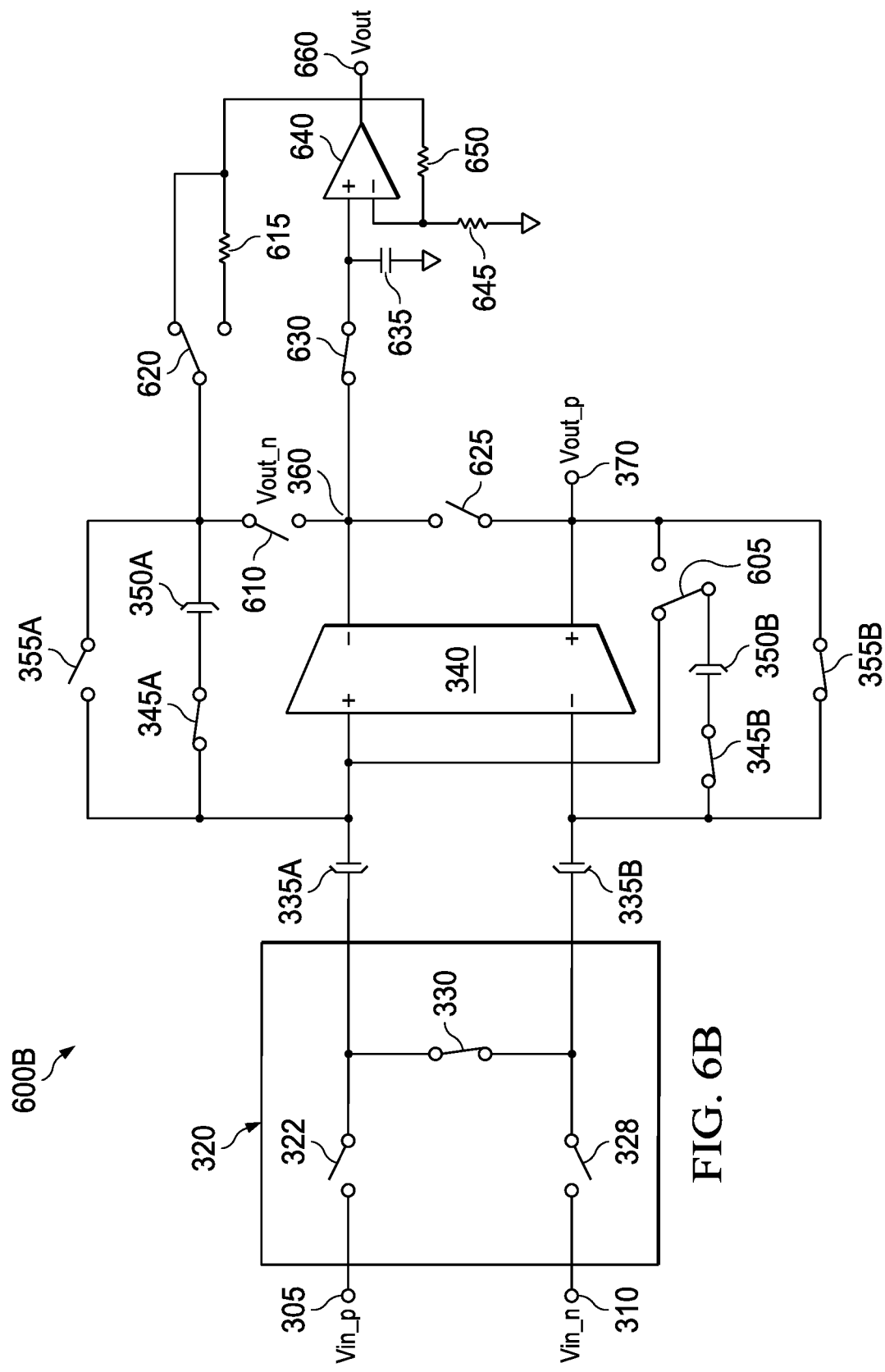

FIGS. 6A-B illustrate the integrator system configurations for a differential to single-ended conversion operating mode and a hold operating mode. For ease of illustration, FIGS. 6A-B are described with reference to the integrator 300 shown in the configurations 300A-C in FIGS. 3A-C. While not included in integration system 600 for ease of illustration, the switched capacitor module 410 shown in FIG. 4 and the switched capacitor module 515 shown in FIG. 5 can be incorporated into integrator system 600 without significant change in operation. FIG. 6A illustrates an integrator system configuration 600A corresponding to a D2S operating mode, and FIG. 6B illustrates an integrator system configuration 600B corresponding to a hold operation mode.

Integrator system 600 includes the integrator 300 shown in FIGS. 3A-C, switches 605, 610, 620, 625, and 630, capacitor 635, resistors 615, 645, and 650, and a buffer 640. Switch 605 is coupled to capacitor 350B, and switches between the positive output and the positive input of amplifier 340. Switch 610 is coupled between capacitor 350A and the negative output of amplifier 340. Switch 620 is coupled to capacitor 350A, and switches between the resistor 615 and the output of buffer 640. The resistor 615 is further coupled to the output of buffer 640.

Switch 625 is coupled between the positive and negative outputs of amplifier 340. Switch 630 is coupled between the negative output of amplifier 340 and the positive input of buffer 640. Capacitor 635 is coupled to the positive input of buffer 640 and to ground. Resistor 645 is coupled to the negative input of buffer 640 and to ground. Resistor 650 is coupled to the negative input and the output of buffer 640. The single-ended output signal Vout 660 is available from the output of buffer 640.

In FIG. 6A, integrator system configuration 600A corresponds to a D2S operating mode. In configuration 600A, switches 322 and 328 are open, and switch 330 is closed. Switch 345A is closed, coupling capacitor 350A to the positive input of amplifier 340, and switch 355A is open. Switch 345B is closed, coupling capacitor 350B to the negative input of amplifier 340, and switch 605 couples capacitor 350B to the positive input of amplifier 340. Switch 355B is closed, coupling the positive output and the negative input of amplifier 340. Switch 610 is open, disconnecting capacitor 350A from the negative output of amplifier 340. Switch 620 couples capacitor 350A to resistor 615. Switch 625 is closed, coupling the positive and negative outputs of amplifier 340. Switch 630 is open, disconnecting the negative output of amplifier 340 from the positive input of buffer 640.

Configuration 600A redistributes the charge stored in output feedback capacitors 350A-B to achieve the full voltage swing at a single output node. After the last integration operation, integrator 600A couples output feedback capacitor 350B to the inputs of amplifier 340. The negative input and positive output of amplifier 340 are coupled together in a unity gain feedback configuration. The closed loop feedback pushes the charge stored on output feedback capacitor 350B to output feedback capacitor 350A. Because output feedback capacitors have approximately the same capacitance and store approximately the same amount of charge, the voltage across output feedback capacitor 350A is approximately doubled to 2Vo.

To reduce variations in Vout_p 370 and Vout_n 360 during the transition from differential to single-ended output mode, switch 625 shorts the positive and negative outputs of amplifier 340, and switch 630 disconnects the negative output of amplifier 340 from the positive input of buffer 640. Capacitor 635 temporarily maintains the value of output signal Vout 660 while switch 630 is open. Resistor 615 reduces variation in the output signal Vout 660 while charge is transferred from output feedback capacitor 350B to output feedback capacitor 350A. By incorporating a D2S function into integrator system 600, the differential to single-ended conversion stage 150 and its amplifier may be eliminated from the integrator system, further reducing the area and power used by integrator system 600.

In FIG. 6B, integrator system configuration 600B corresponds to a hold operating mode. In configuration 600B, switches 322 and 328 are open, and switch 330 is closed. Switch 345A is closed, coupling capacitor 350A to the positive input of amplifier 340, and switch 355A is open. Switch 345B is closed, coupling capacitor 350B to the negative input of amplifier 340, and switch 605 couples capacitor 350B to the positive input of amplifier 340. Switch 355B is closed, coupling the positive output and the negative input of amplifier 340. Switch 610 is open, disconnecting capacitor 350A from the negative output of amplifier 340. Switch 620 couples capacitor 350A to the output of buffer 640. Switch 625 is open, disconnecting the positive and negative outputs of amplifier 340. Switch 630 is closed, coupling the negative output of amplifier 340 to the positive input of buffer 640.

After the charge transfer from output feedback capacitor 350B to capacitor 350A during the D2S operating mode is completed, integrator system 600 reconfigures for a hold operating mode in which the single-ended integrator output from amplifier 340 is coupled to the input of buffer 640 to hold the output signal. For the example with four S/I operations, the output signal Vout_n 360 from amplifier 340 may be represented as:

$$\frac{Vdd}{2} + 2\left[\left(\frac{Cs}{Cf}\right) * (Vin\ p\ 305 - Vinn\ 310)\right]$$

where Vdd represents a supply voltage, Cs represents the capacitance of input sampling capacitor 335A, and Cf represents the capacitance of output feedback capacitor 350A.

The output signal Vout 660 may be represented as:

$$\frac{Vdd}{2} + 4\left[\left(\frac{Cs}{Cf}\right) * (Vin\ p\ 305 - Vinn\ 310)\right]$$

For the example in which capacitors 335A-B have a capacitance value of twelve times a capacitance C (12C), capacitors 350A-B have a capacitance value of 4C, and capacitors 435A-B have a capacitance value of C, the output signal Vout 660 may be represented as:

$$4 * \frac{12C}{4C} * Vin + 4 * \frac{C}{4C} * Vref = 12Vin + Vref$$

Figure 7:
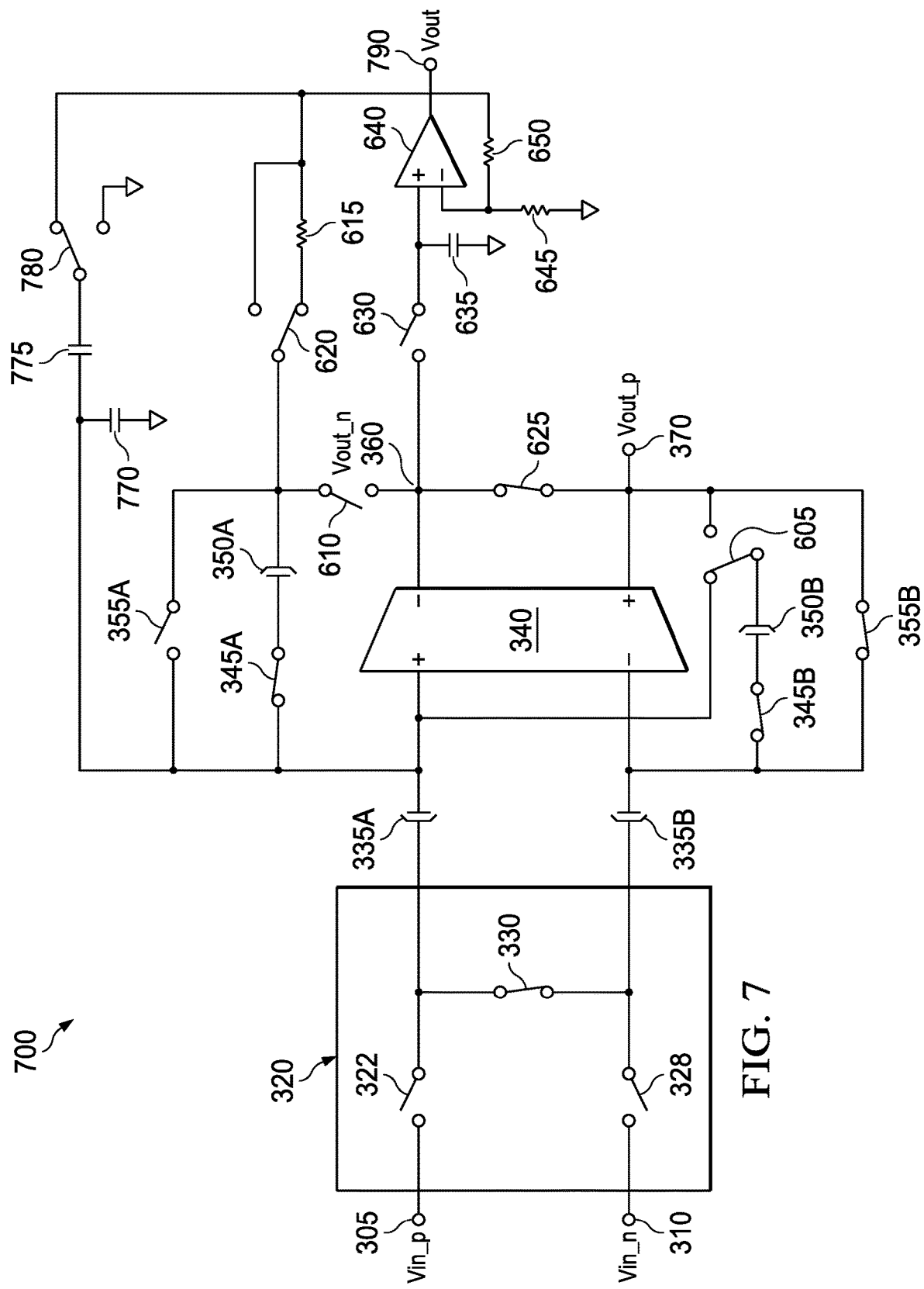
FIG. 7 illustrates an integrator system with reduced parasitic and transient errors during a differential to single-ended conversion operating mode.

FIG. 7 illustrates an integration system 700 with parasitic capacitance compensation. For ease of illustration, integration system 700 is described with reference to the integrator 300 shown in FIGS. 3A-C and integrator 600 shown in FIGS. 6A-B. While not included in integration system 700 for ease of explanation, the switched capacitor module 410 shown in FIG. 4 and the switched capacitor module 515 shown in FIG. 5 can be incorporated into integration system 700 without significant change in operation. While integration system 700 operates in a D2S mode and output feedback capacitor 350B is coupled to the positive and negative inputs of amplifier 340, the change in the bottom plate voltage of capacitor 350B may cause charge loss resulting from parasitic capacitance associated with the bottom place, represented by capacitor 770.

To compensate for the parasitic capacitance represented by capacitor 770 in D2S operating mode, a compensation capacitor 775 is coupled between the positive input of amplifier 340 and the output of buffer 640 by switch 780. The output signal Vout 790 from buffer 640 charges compensation capacitor 775, which reduces parasitic capacitance and transient errors in Vout 790 during D2S operating mode. While not in D2S operating mode, switch 780 disconnects compensation capacitor 775 from the output of buffer 640 and connects it to ground.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
   a switched capacitor module configured to receive a positive differential input signal and a negative differential input signal, comprising a switching network, a first sampling capacitor, and a second sampling capacitor;
   an integrator having a positive input coupled to the first sampling capacitor, a negative input coupled to the second sampling capacitor, a positive output, and a negative output;
   a first feedback loop, comprising:
      a first switch coupled between the positive input and the negative output;
      a second switch coupled to the positive input
      a first feedback capacitor coupled between the second switch and the negative output;
   a second feedback loop, comprising:
      a third switch coupled between the negative input and the positive output;
      a fourth switch coupled to the negative input; and
      a second feedback capacitor coupled between the fourth switch and the positive output;
   a fifth switch coupled between the first feedback capacitor and the negative output;
   a sixth switch configured to couple the second feedback capacitor to the positive output or to the positive input;
   a seventh switch coupled between the negative and positive outputs;
   an output buffer;
   an eighth switch coupled between the negative output and an input of the output buffer; and
   a ninth switch configured to couple the first feedback capacitor to an output of the output buffer or to a resistor, wherein the resistor is further coupled to the output of the output buffer.

2. The circuit of claim 1, wherein in a reset operating mode:
   the switching network disconnects the first and second sampling capacitors from the positive and negative differential input signals and couples the first and second sampling capacitors to each other; and
   the first, second, third, and fourth switches are closed.

3. The circuit of claim 1, wherein in a sampling operating mode:
   the first and third switches are closed;
   the second and fourth switches are open; and
   the switching network provides the positive differential input signal to the first sampling capacitor and the negative differential input signal to the second sampling capacitor and uncouples the first and second sampling capacitors from each other.

4. The circuit of claim 1, wherein in an integrating operating mode:
the first and third switches are open;
the second and fourth switches are closed; and
the switching network disconnects the first and second sampling capacitors from the positive and negative differential input signals and couples the first and second sampling capacitors to each other.

5. The circuit of claim 1, wherein in a differential to single-ended conversion operating mode:
the switching network disconnects the first and second sampling capacitors from the positive and negative differential input signals and couples the first and second sampling capacitors to each other;
the first, fifth, and eighth switches are open;
the second, third, fourth, and seventh switches are closed;
the sixth switch couples the second feedback capacitor to the positive input; and
the ninth switch couples the first feedback capacitor to the resistor.

6. The circuit of claim 5, further comprising:
a compensation capacitor coupled to the positive input; and
a tenth switch configured to couple the compensation capacitor to the output of the output buffer or to ground, wherein in the differential to single-ended conversion operating mode, the tenth switch couples the compensation capacitor to the output of the output buffer, and wherein in operating modes not the differential to single-ended conversion operating mode, the tenth switch couples the compensation capacitor to ground.

7. The circuit of claim 1, wherein in a holding operating mode:
the switching network disconnects the first and second sampling capacitors from the positive and negative differential input signals and couples the first and second sampling capacitors to each other;
the first, fifth, and seventh switches are open;
the second, third, fourth, and eighth switches are closed;
the sixth switch couples the second feedback capacitor to the positive input; and
the ninth switch couples the first feedback capacitor to the output of the output buffer.

8. The circuit of claim 1, wherein:
the switched capacitor module comprises a first switched capacitor module;
the switching network comprises a first switching network; and
the circuit further comprises a second switched capacitor module configured to receive a reference voltage, the second switched capacitor module comprising:
a second switching network configured to receive the reference voltage and coupled between the positive and negative inputs and the negative output;
a first capacitor; and
a second capacitor.

9. The circuit of claim 1, wherein:
the switched capacitor module comprises a first switched capacitor module;
the switching network comprises a first switching network; and
the circuit further comprising a second switched capacitor module, the second switched capacitor module comprising:
a second switching network coupled between the positive and negative inputs and the positive and negative outputs;
a first capacitor; and
a second capacitor.

* * * * *